(12) United States Patent
Park et al.

(10) Patent No.: US 10,711,160 B2
(45) Date of Patent: Jul. 14, 2020

(54) SLURRY COMPOSITIONS FOR POLISHING A METAL LAYER AND METHODS FOR FABRICATING SEMICONDUCTOR DEVICES USING THE SAME

(71) Applicants: Samsung Electronics Co., Ltd., Suwon-si, Gyeonggi-do (KR); KCTECH CO., LTD., Anseong-si, Gyeonggi-do (KR)

(72) Inventors: Seung Ho Park, Suwon-si (KR); Hyun Goo Kong, Suwon-si (KR); Jung Hun Kim, Anyang-si (KR); Sang Mi Lee, Daegu (KR); Woo In Lee, Goyang-si (KR); Hee Sook Cheon, Seoul (KR); Sang Kyun Kim, Hwaseong-si (KR); Hao Cui, Suwon-si (KR); Jong Hyuk Park, Hwaseong-si (KR); Il Young Yoon, Hwaseong-si (KR)

(73) Assignees: SAMSUNG ELECTRONICS CO., LTD., Samsung-ro, Yeongtong-gu, Suwon-si, Gyeonggi-do (KR); KCTECH Co., Ltd., Miyang-myeon, Anseong-si, Gyeonggi-do (KR)

(*) Notice: Subject to any disclaimer, the term of this patent is extended or adjusted under 35 U.S.C. 154(b) by 79 days.

(21) Appl. No.: 15/883,655

(22) Filed: Jan. 30, 2018

(65) Prior Publication Data

US 2018/0355213 A1    Dec. 13, 2018

(30) Foreign Application Priority Data

Jun. 12, 2017 (KR) .................. 10-2017-0073205

(51) Int. Cl.
*H01L 21/3205* (2006.01)
*C09G 1/02* (2006.01)
(Continued)

(52) U.S. Cl.
CPC .......... *C09G 1/02* (2013.01); *H01L 21/28123* (2013.01); *H01L 21/3212* (2013.01);
(Continued)

(58) Field of Classification Search
CPC .................... H01L 21/28079; H01L 27/10814
(Continued)

(56) References Cited

U.S. PATENT DOCUMENTS 6,776,810 B1   8/2004   Cherian et al.
7,306,637 B2   12/2007  Cherian et al.
(Continued)

FOREIGN PATENT DOCUMENTS

JP   4990543 B2   5/2012
JP   5323415 B2   7/2013
(Continued)

*Primary Examiner* — Caleb E Henry
(74) *Attorney, Agent, or Firm* — Muir Patent Law, PLLC (57) ABSTRACT

A slurry composition for polishing a metal layer and a method for fabricating a semiconductor device using the same are provided. The slurry composition for polishing a metal layer includes polishing particles including a metal oxide, an oxidizer including hydrogen peroxide, and a first polishing regulator including at least one selected from a group consisting of phosphate, phosphite, hypophosphite, and metaphosphate, wherein a content of the oxidizer is 0.01 wt % to 0.09 wt % with respect to 100 wt % of the slurry composition for polishing the metal layer.

15 Claims, 4 Drawing Sheets

(51) Int. Cl.
*H01L 21/28* (2006.01)
*H01L 21/321* (2006.01)
*H01L 27/108* (2006.01)

(52) U.S. Cl.
CPC .. *H01L 21/28079* (2013.01); *H01L 27/10814* (2013.01); *H01L 27/10823* (2013.01); *H01L 27/10876* (2013.01)

(58) Field of Classification Search
USPC .................................. 438/589; 51/307; 106/3
See application file for complete search history.

(56) References Cited

U.S. PATENT DOCUMENTS

| | | | |
|---|---|---|---|
| 7,344,988 B2* | 3/2008 | Chelle | B24B 37/044 216/53 |
| 7,785,487 B2 | 8/2010 | Thomas et al. | |
| 8,304,344 B2 | 11/2012 | Boggs et al. | |
| 8,338,300 B2 | 12/2012 | Lee et al. | |
| 8,529,680 B2* | 9/2013 | De Rege Thesauro | H01L 21/3212 106/3 |
| 2002/0095872 A1* | 7/2002 | Tsuchiya | C09G 1/02 51/307 |
| 2005/0072054 A1* | 4/2005 | Fang | C09G 1/02 51/307 |
| 2005/0194358 A1* | 9/2005 | Chelle | B24B 37/044 216/88 |
| 2006/0000808 A1* | 1/2006 | Seki | C09G 1/04 216/88 |
| 2007/0011952 A1* | 1/2007 | Fang | C09G 1/02 51/308 |
| 2007/0068086 A1* | 3/2007 | Akatsuka | C09G 1/02 51/307 |
| 2007/0224806 A1 | 9/2007 | Yamashita | |
| 2008/0149591 A1 | 6/2008 | Siddiqui et al. | |
| 2009/0032765 A1 | 2/2009 | Bian et al. | |
| 2016/0020087 A1 | 1/2016 | Liu et al. | |
| 2016/0122590 A1 | 5/2016 | Lew et al. | |
| 2016/0237315 A1 | 8/2016 | Stender et al. | |

FOREIGN PATENT DOCUMENTS

| | | |
|---|---|---|
| KR | 10-2001-0035669 A | 5/2001 |
| KR | 10-0442549 B1 | 7/2004 |
| KR | 10-2006-0099313 A | 9/2006 |
| KR | 10-2008-0025595 A | 3/2008 |
| KR | 10-2010-0084197 A | 7/2010 |
| KR | 10-0972730 B1 | 7/2010 |
| KR | 10-1279969 B1 | 6/2013 |
| KR | 10-2014-0139498 A | 12/2014 |
| KR | 10-1481573 B1 | 1/2015 |
| WO | WO 03/068883 A1 | 8/2003 |
| WO | WO 2013/123317 A1 | 8/2013 |

* cited by examiner

SLURRY COMPOSITIONS FOR POLISHING A METAL LAYER AND METHODS FOR FABRICATING SEMICONDUCTOR DEVICES USING THE SAME

This application claims priority from Korean Patent Application No. 10-2017-0073205 filed on Jun. 12, 2017 in the Korean Intellectual Property Office, the disclosure of which is incorporated herein by reference in its entirety.

FIELD

The present inventive concept relates to a slurry composition for polishing a metal layer, and a method for fabricating a semiconductor device using the same. Specifically, the present inventive concept relates to a slurry composition for polishing a metal layer including a polishing regulator, and a method for fabricating a semiconductor device using the same.

BACKGROUND

In a planarization process of a layer, for example, an etch-back process, a reflow process, a chemical mechanical polishing (CMP) process, and the like may be used. The chemical mechanical polishing process is advantageous for a wide area planarization.

In the chemical mechanical polishing process, a polishing target to be polished is mounted on a polishing apparatus, and a slurry composition containing a polishing agent may be provided between a polishing target and a polishing pad. At the same time, by rotating the polishing target in the state of being in contact with the polishing pad, the surface of the polishing target can be planarized. That is, the chemical mechanical polishing process is a process of mechanically polishing the surface of the polishing target by mechanically rubbing the polishing agent contained in the slurry composition and the surface protrusion of the polishing pad with the surface of the polishing target, and chemically removing the surface of the polishing target by causing the chemical components contained in the slurry composition and the surface of the polishing target to chemically react with each other.

Meanwhile, the oxidizer used in the slurry for polishing the metal layer may cause excessive oxidative etching of the metal layer. Such oxidative etching may intensify the surface roughness of the metal layer after the polishing process and may degrade the electric characteristics of the semiconductor device fabricated using the polishing process. Although slurry for polishing the metal layer with the lowered oxidizer content may be used, such slurry may have a problem of significantly lowering the polishing rate.

SUMMARY

An aspect of the present inventive concept provides a slurry composition for polishing a metal layer which minimizes the oxidative etching and provides a high polishing rate.

Another aspect of the present inventive concept provides a method for fabricating a semiconductor device which improves electrical characteristics of a semiconductor device.

According to aspects of the present inventive concept, there is provided a slurry composition for polishing a metal layer, the slurry composition comprising polishing particles containing a metal oxide, an oxidizer containing hydrogen peroxide, and a first polishing regulator containing at least one selected from a group consisting of phosphate, phosphite, hypophosphite, and metaphosphate, wherein a content of the oxidizer is 0.01 wt % to 0.09 wt % with respect to 100 wt % of the slurry composition for polishing the metal layer.

According to aspects of the present inventive concept, there is provided a slurry composition for polishing a metal layer, the slurry composition comprising polishing particles, an oxidizer, and a polishing regulator, wherein the polishing regulator includes on the basis of 100 wt % of the slurry composition for polishing the metal layer, 1 wt % to 6 wt % of a first polishing regulator containing at least one selected from a group consisting of phosphate, phosphite, hypophosphite, and metaphosphate, 1 wt % to 5 wt % of a second polishing regulator containing persulfate, and 1 wt % 3 wt % of a third polishing regulator containing iron (III) compound.

According to aspects of the present inventive concept, there is provided a method for fabricating a semiconductor device, the method comprising forming a trench in a substrate, forming a metal layer which fills the trench, and planarizing an upper surface of the metal layer, using a slurry composition for polishing the metal layer, wherein the slurry composition for polishing the metal layer comprises polishing particles containing a metal oxide, an oxidizer containing hydrogen peroxide, and a first polishing regulator containing at least one selected from a group consisting of phosphate, phosphite, hypophosphite, and metaphosphate, a content of the oxidizer being 0.01 wt % to 0.09 wt % with respect to 100 wt % of the slurry composition for polishing the metal layer.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION

Hereinafter, a slurry composition for polishing a metal layer according to some embodiments of the present inventive concept will be described with reference to embodiments and drawings. However, the present inventive concept is not limited the embodiments and drawings.

The slurry composition for polishing the metal layer according to some embodiments prevents excessive oxidative etching of the metal layer to be polished, thereby making it possible to sufficiently reduce the surface roughness of the metal layer and ensure a sufficient polishing. The slurry composition for polishing the metal layer according to some embodiments may include polishing particles, an oxidizer, a first polishing regulator, and a solvent.

The polishing particles may function as a polishing agent of the slurry composition. The polishing particles include a metal oxide. For example, the polishing particles may include at least any one selected from the group consisting of a metal oxide, a metal oxide coated with an organic or inorganic matter, and the metal oxide of a colloidal state. Further, for example, the metal oxide may include at least any one selected from the group consisting of silica, ceria, zirconia, alumina, titania, barium titania, germania, mangania and magnesia.

The shape of the polishing particles may be a spherical shape, a square shape, a needle-like shape or a plate-like shape.

The size of the polishing particles may be in the range from 40 nm to 130 nm. When the size of the polishing particles is less than 40 nm, sufficient polishing rate may not be ensured in the chemical mechanical polishing process. When the size of the polishing particles exceeds 130 nm, the polishing rate increases significantly. Also, this makes it difficult to adjust the polishing selectivity, and dishing, erosion, and surface defects may be generated.

The polishing particles may include particles of a single size, but may also include particles of a size obtained by mixing by two or more kinds. For example, the polishing particle has the size adjusted during the fabricating process, and may have a particle size distribution in the form of a bimodal in which two kinds of particles are mixed. Alternatively, the polishing particles may have a particle size distribution in which three kinds of particles are mixed to exhibit three peaks. Since the polishing particles of the relatively larger size and the polishing particles of the relatively smaller size are mixed with each other, the overall polishing particles may have excellent dispersibility. Further, such polishing particles may also reduce scratches on the polishing target.

The content of the polishing particles may be 1 wt % to 6 wt % with respect to 100 wt % of the slurry composition for polishing the metal layer. When the content of the polishing particles is less than 1 wt %, the sufficient polishing rate may not be ensured in the chemical mechanical polishing process. When the content of the polishing particles exceeds 6 wt %, the polishing rate and the polishing rate excessively increase and the excessive polishing regulator may occur. In addition, as the number of polishing particles increases, surface defects may occur in the polished object at least due to particle adsorbability that remains on the surface of the polishing target. A polishing regulator serves as a conditioning agent that improves the polishing rate.

The oxidizer may include a peroxide-based compound. For example, the oxidizer may include hydrogen peroxide. When the polishing target is a metal layer, the oxidizer may have a higher oxidation/reduction potential than the polishing target. That is, the oxidizer may be removed by oxidizing the metal layer in the chemical mechanical polishing process.

The content of the oxidizer may be 0.01 wt % to 0.09 wt % with respect to 100 wt % of the slurry composition for polishing the metal layer. When the content of the oxidizer is 0.01 wt % or more, it is possible to secure a sufficient polishing rate in the chemical mechanical polishing process. When the content of the oxidizer is 0.09 wt % or less, it is possible to sufficiently reduce the surface roughness of the metal layer after polishing by preventing the excessive oxidative etching of the metal layer to be polished. More preferably, the content of the oxidizer may be 0.03 wt % to 0.07 wt % with respect to 100 wt % of the slurry composition for polishing the metal layer.

The first polishing regulator may be a compound containing at least one selected from the group consisting of phosphate, phosphite, hypophosphite and metaphosphate, or salt thereof.

For example, the first polishing regulator may include at least one selected from the group consisting of potassium phosphate, potassium monohydrogen phosphate, potassium dihydrogen phosphate, ammonium phosphate, monoammonium phosphate, diammonium hydrogen phosphate, aluminum phosphate, sodium phosphate, disodium hydrogen phosphate, carbamoyl phosphate, calcium phosphate, triallyl phosphate, vanadium phosphate, magnesium phosphate, aluminum hypophosphite, vanadium hypophosphite, manganese hypophosphite, zinc hypophosphite, nickel hypophosphite, cobalt hypophosphite, ammonium hypophosphite, potassium hypophosphite, manganese phosphate, lead phosphate, nickel phosphate, cobalt phosphate, sodium trimetaphosphate, sodium pentametaphosphate, sodium hexametaphosphate, sodium polymetaphosphate, sodium hypophosphite, ammonium trimetaphosphate, ammonium pentametaphosphate, ammonium hexametaphosphate, ammonium polymetaphosphate, ammonium hypophosphite, potassium trimetaphosphate, potassium hexametaphosphate, potassium polymetaphosphate, potassium hypophosphite, and calcium hypophosphite. However, the present disclosure is not limited thereto.

The content of the first polishing regulator may be 1 wt % to 6 wt % with respect to 100 wt % of the slurry composition for polishing the metal layer. When the content of the first polishing regulator is 1 wt % or more, a sufficient polishing rate may be secured in the chemical mechanical polishing process. When the content of the first polishing regulator is 6 wt % or less, excessive oxidative etching of the metal layer to be polished can be sufficiently prevented. More preferably, the content of the first polishing regulator may be 1.5 wt % to 5 wt % with respect to 100 wt % of the slurry composition for polishing the metal layer.

The solvent may include deionized water. The solvent may also serve as a dispersion medium. For example, the above-mentioned solvent may be a solvent in relation to a substance that is easily dissolved in a solvent such as the first polishing regulator. However, the solvent may serve as a dispersion medium in relation to fine particles such as polishing particles. That is, although the aforementioned solvent may serve as a solvent but at the same time serve as a dispersion medium, as would be understood by those skilled in the art, it is referred to as a "solvent" for convenience in the present specification.

The solvent may be contained in the remainder of the slurry composition for polishing the metal layer.

The oxidizer used in the slurry for polishing the metal layer may induce excessive oxidative etching of the metal layer. The oxidative etching may intensify the surface roughness of the metal layer after the polishing process and may lower the electrical characteristics of the semiconductor device fabricated using the polishing process.

Thus, the slurry composition for polishing the metal layer according to some embodiments of the technical concept of the present inventive concept may contain a small amount of oxidizer to minimize the oxidative etching of the metal layer. As described above, the slurry composition for polishing the metal layer may contain only 0.01 wt % to 0.09 wt % of the oxidizer to minimize the oxidative etching of the metal layer.

However, the slurry for polishing the metal layer with a lowered content of oxidizer has a problem of significantly lowering the polishing rate. Thus, the slurry composition for polishing a metal layer according to some embodiments of the present inventive may include the first polishing regulator to improve a polishing rate.

The first polishing regulator may react with at least a part of the oxidizer to produce peroxy acid. For example, the first polishing regulator containing phosphate may react with hydrogen peroxide to produce peroxy (mono) phosphoric acid.

The peroxy generated from the first polishing regulator may assist removal of the metal layer to be polished.

Specifically, the peroxy generated from the first polishing regulator may increase the amount of surface oxidation of the metal layer to be polished. For example, when the polishing target is a tungsten layer, peroxy (mono) phosphoric acid generated from the first polishing regulator containing a phosphate may increase the amount of the surface oxidation of the tungsten layer. Thus, the first polishing regulator may improve the polishing rate in the chemical mechanical polishing process.

That is, the slurry composition for polishing the metal layer according to some embodiments of the present inventive concept prevents the excessive oxidative etching of the metal layer to be polished, thereby making it possible to sufficiently reduce the surface roughness of the metal layer and ensure a sufficient polishing rate. Thus, the slurry composition for polishing the metal layer may improve the next generation high integration process.

The slurry composition for polishing the metal layer according to some embodiments may further include a second polishing regulator.

The second polishing regulator may include persulfate or a compound containing the same.

For example, the second polishing regulator may include at least one selected from the group consisting of ammonium persulfate, sodium persulfate, potassium persulfate, iron (II) persulfate, lead (II) persulfate, iron (III) persulfate, tin (IV) persulfate, lead (IV) persulfate, nickel (II) persulfate, tin (II) persulfate, antimony (III) persulfate, copper (I) persulfate, copper (II) persulfate, aluminum persulfate, silver persulfate, manganese persulfate, calcium persulfate, zinc persulfate, barium persulfate, chromium (II) persulfate, lithium persulfate, potassium monopresulfate, sodium monopersulfate, and persulfuric acid. However, the present disclosure is not limited thereto.

The content of the second polishing regulator may be 1 wt % to 5 wt % with respect to 100 wt % of the slurry composition for polishing the metal layer. When the content of the second polishing regulator is less than 1 wt %, sufficient polishing rate may not be ensured in the chemical mechanical polishing process. When the content of the second polishing regulator exceeds 5 wt %, dispersion stability of the slurry composition for polishing the metal layer may be lowered.

The slurry composition for polishing the metal layer according to some embodiments may further include a third polishing regulator.

The third polishing regulator may include iron (III) or a compound including the same.

For example, the third polishing regulator may include at least one selected from a group consisting of iron sucrose, iron (III) oxide, iron (III) acetate, iron (III) sulfate, lithium iron (III) oxide, iron (III) phosphate, iron (III) pyrophosphate, iron (III) ionophore IV, ammonium iron (III) hexacyanoferrate (II), iron (III) ferrocyanide, iron (III) i-propoxide, iron (III) oxo acetate perchlorate, ammonium iron (III) citrate, iron (III) dicarbonate, iron (III) acetylacetonate, iron (III) bromide, iron (III) chloride, iron (III) arsenide, iron (III) oxalate, ammonium iron (III) oxalate iron (III) oxalate, iron (III) fluoride, iron (III) iodide, iron (III) nitrate, iron (III) phthalocyanine chloride, iron (III) perchloric, iron (III) sulphate, ammonium iron (III) sulphate, and iron (III) tartrate. However, the present disclosure is not limited thereto.

The content of the third polishing regulator may be 1 wt % to 5 wt % with respect to 100 wt % of the slurry composition for polishing the metal layer. When the content of the third polishing regulator is less than 1 wt %, the sufficient polishing rate may not be secured in the chemical mechanical polishing process. When the content of the third polishing regulator exceeds 5 wt %, the dispersion stability of the slurry composition for polishing the metal layer may be lowered.

The slurry composition for polishing the metal layer according to some embodiments may further include a pH adjuster.

The pH adjuster may adjust the range of pH that prevents corrosion of the polishing target or the polishing apparatus and facilitates oxidation of the metal layer to be polished.

The pH adjuster may include acidic substance including at least one selected from a group consisting of hydrochloric acid, phosphoric acid, sulfuric acid, hydrofluoric acid, bromic acid, iodic acid, formic acid, malonic acid, maleic acid, oxalic acid, acetic acid, adipic acid, citric acid, acetic acid, propionic acid, fumaric acid, lactic acid, salicylic acid, pimelic acid, benzoic acid, succinic acid, phthalic acid, butyric acid, glutaric acid, glutamic acid, glycolic acid, lactic acid, aspartic acid, tartaric acid and salts thereof.

The pH adjuster may include a basic substance containing at least one selected from the group consisting of ammonia, AMP (ammonium methyl propanol), TMAH (tetra methyl ammonium hydroxide), potassium hydroxide, sodium hydroxide, magnesium hydroxide, rubidium hydroxide, cesium hydroxide, sodium hydrogen carbonate, sodium carbonate, and imidazole.

Hereinafter, the present inventive concept will be specifically described with reference to the following examples. The following embodiments are only for explaining the present inventive concept, and the present disclosure is not limited thereto.

Example 1

3.0 wt % of silica having a particle diameter of 100 nm as polishing particles, 0.05 wt % of hydrogen peroxide as an oxidizer, 3.0 wt % of potassium phosphate as a first polishing regulator, 3 wt % of ammonium persulfate as a second polishing regulator, and 3 wt % of iron sucrose as a third polishing regulator were mixed with each other to fabricate a slurry composition for polishing the metal layer.

Example 2

The slurry composition for polishing the metal layer was fabricated in the same manner as in Example 1 except that the content of the first polishing regulator was changed to 1.5 wt % in Example 1.

Example 3

The slurry composition for polishing the metal layer was fabricated in the same manner as in Example 1 except that the content of the first polishing regulator was changed to 5.0 wt % in Example 1.

Example 4

The slurry composition for polishing the metal layer was fabricated in the same manner as in Example 1 except that the content of the oxidizer was changed to 0.07 wt % in Example 1.

Example 5

The slurry composition for polishing the metal layer was fabricated in the same manner as in Example 1 except that the content of the oxidizer was changed to 0.08 wt % in Example 1.

Comparative Example 1

The slurry composition for polishing the metal layer was fabricated in the same manner as in Example 1 except that the first polishing regulator was not used in Example 1.

Comparative Example 2

The slurry composition for polishing the metal layer was fabricated in the same manner as in Example 1, except that the content of the first polishing regulator was changed to 0.5 wt % in Example 1.

Comparative Example 3

The slurry composition for polishing the metal layer was fabricated in the same manner as in Example 1, except that the content of the first polishing regulator was changed to 7.0 wt % in Example 1.

Comparative Example 4

The slurry composition for polishing the metal layer was fabricated in the same manner as in Example 1 except that the content of the oxidizer was changed to 0.1 wt % in Example 1.

Comparative Example 5

The slurry composition for polishing the metal layer was fabricated in the same manner as in Example 1 except that the content of the oxidizer was changed to 0.3 wt % in Example 1.

Values of the content of the oxidizer, the content of the first polishing regulator and the polishing rate (RR: Removal Rate), SER (Static Etch Rate), and the surface roughness of Examples 1 to 5 and Comparative Examples 1 to 5 are illustrated in Table 1 below.

TABLE 1

| | Weight % | | RR (Å/min) | SER (Å/min) | Surface roughness (nm) |
|---|---|---|---|---|---|
| | Oxidizer | First polishing regulator | | | |
| Example 1 | 0.05 | 3.0 | 295 | 17 | 1.48 |
| Example 2 | 0.05 | 1.5 | 236 | 14 | 1.53 |
| Example 3 | 0.05 | 5.0 | 390 | 15 | 1.46 |
| Example 4 | 0.07 | 3.0 | 314 | 15 | 1.37 |
| Example 5 | 0.08 | 3.0 | 332 | 12 | 1.43 |
| Comparative Example 1 | 0.05 | X | 151 | 26 | 2.04 |
| Comparative Example 2 | 0.05 | 0.5 | 168 | 15 | 2.13 |
| Comparative Example 3 | 0.05 | 7.0 | 436 | 23 | 2.55 |
| Comparative Example 4 | 0.1 | 3.0 | 379 | 31 | 2.15 |
| Comparative Example 5 | 0.3 | 3.0 | 419 | 42 | 2.43 |

[Measuring Method of Polishing Rate]

ST01 300 (mm, manufactured by KTTECH) was used as a polishing apparatus, and a KPX pad was used as a pad. A tungsten layer having a thickness of 650 Å was polished, under polishing conditions of a pressure of 3.0 psi, a temperature of 25° C., a polishing time of 30 seconds, a platen speed of 100 rpm, a head speed of 103 rpm, and a slurry flow rate of 200 ml/min

[Measuring Method of Static Etch Rate]

A tungsten coupon wafer having a thickness of 5,000 Å 2 cm$^2$ was immersed in a container containing 30 g of the slurry composition for polishing the metal layer of 60° C. for 10 minutes, and then washed. Thereafter, the thickness of the tungsten wafer before and after immersion was measured at the center of the wafer at 5 mm intervals in the vertical and horizontal directions using 4 point probe, and then, the value of the static etch rate (SER) was calculated. The value of the static etch rate (SER) may be calculated by the following equation 1, and its unit is Å/min.

$$SER = (\text{thickness of wafer before immersion} - \text{thickness of wafer after immersion})/10 \quad [\text{Equation 1}]$$

[Measuring Method of Surface Roughness]

XE-100 (PSIA Inc.) was used as a measuring device of surface roughness, and the scan size was measured as 10 μm.

As illustrated in Table 1, it is possible to understand that Examples 1 to 5 have a high polishing rate of 200 Å/min or more and a low static etch rate of 20 Å/min or less. Further, the tungsten coupon wafer polished using the slurry composition for polishing the metal layer of Examples 1 to 5 exhibits a relatively low surface roughness.

Specifically, comparing Example 1 with Comparative Example 1, it is possible to understand that, when the slurry composition for polishing the metal layer contains the first polishing regulator, the polishing rate significantly increases. Also, it is possible to understand that, when the slurry composition for polishing the metal layer contains the first polishing regulator, the static etch rate remarkably decreases and low surface roughness is exhibited.

Comparing Example 2 with Comparative Example 2, it is possible to understand that, when the content of the first polishing regulator is 1 wt % or more, a higher polishing rate is exhibited. At this time, it is possible to understand that the static etch rate of Example 2 is 17 Å/min and the surface roughness is 1.53 nm, Example 2 exhibits a still lower static etch rate and surface roughness.

Comparing Example 3 with Comparative Example 3, it is possible to understand that when the content of the first polishing regulator is 6 wt % or less, lower static etch rate and surface roughness are exhibited. At this time, it is possible to understand that the polishing rate of Example 3 is 390 Å/min, and still high polishing rate is exhibited.

Comparing Example 4, Example 5, Comparative Example 4, and Comparative Example 5 with each other, it is possible to understand that, when the content of the oxidizer is 0.09 wt % or less, the static etch rate and the surface roughness remarkably decrease. At this time, it is possible to understand that the polishing rates of Example 4 and Example 5 exhibit still high polishing rates of 314 Å/min and 332 Å/min, respectively.

Hereinafter, a method for fabricating a semiconductor device according to some embodiments of the present inventive concept will be described with reference to FIGS. 1 to 7.

FIGS. 1 to 7 are intermediate step diagrams for explaining a method for fabricating a semiconductor device according to some embodiments of the present inventive concept.

Figure 1:
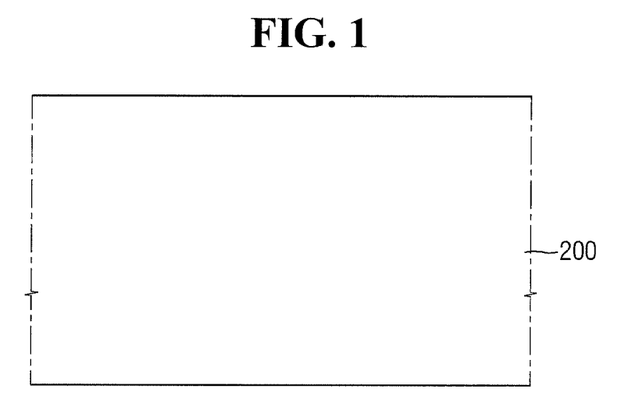
FIGS. 1 to 7 are intermediate step diagrams for explaining a method for fabricating a semiconductor device according to some embodiments of the present inventive concept.

Referring to FIG. 1, a substrate 200 is provided.

The substrate 200 may include a silicon substrate, a gallium arsenide substrate, a silicon germanium substrate, a ceramic substrate, a quartz substrate, a glass substrate for display, or the like. Hereinafter, the substrate 200 will be exemplarily explained as a silicon substrate.

Figure 2:
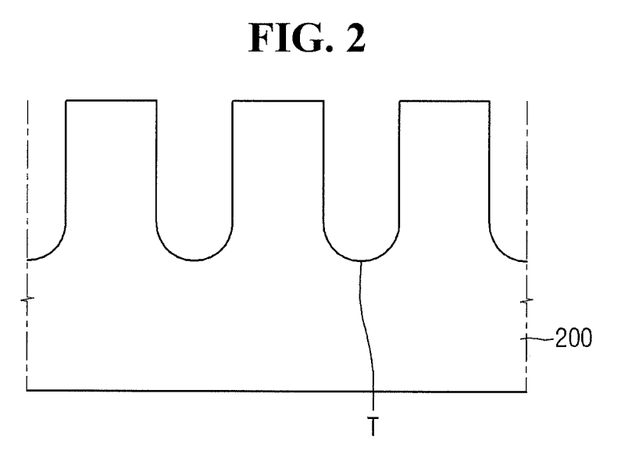

Referring to FIG. 2, a plurality of trenches T is formed inside the substrate 200.

Each trench T may be formed, using an etching process. For example, each trench T may be formed, using a dry etching process. Specifically, a mask pattern may be formed on the substrate 200. The mask pattern may expose the region in which each trench T is formed. The mask pattern may include an oxide layer, a nitride layer, an oxynitride layer, or a combination thereof, but the present disclosure is not limited thereto. Subsequently, a portion exposed by the mask pattern may be etched to form the plurality of trenches T inside the substrate 200.

Figure 3:
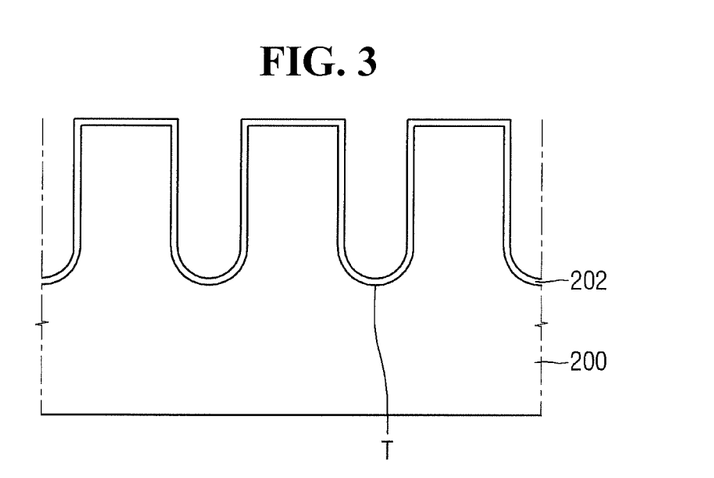

Referring to FIG. 3, an insulating layer 202 is formed on the substrate 200 and each of the trenches T.

The insulating layer 202 may be formed substantially conformally along the upper surface of the substrate 200 and the upper surface of the respective trenches T.

The insulating layer 202 may include at least one of a silicon oxide layer, a silicon nitride layer, a silicon oxynitride layer, or a high dielectric constant material. Here, the high dielectric constant material may include, for example, at least one of $HfO_2$, $ZrO_2$, or $Ta_2O_5$, but the present disclosure is not limited thereto.

Figure 4:
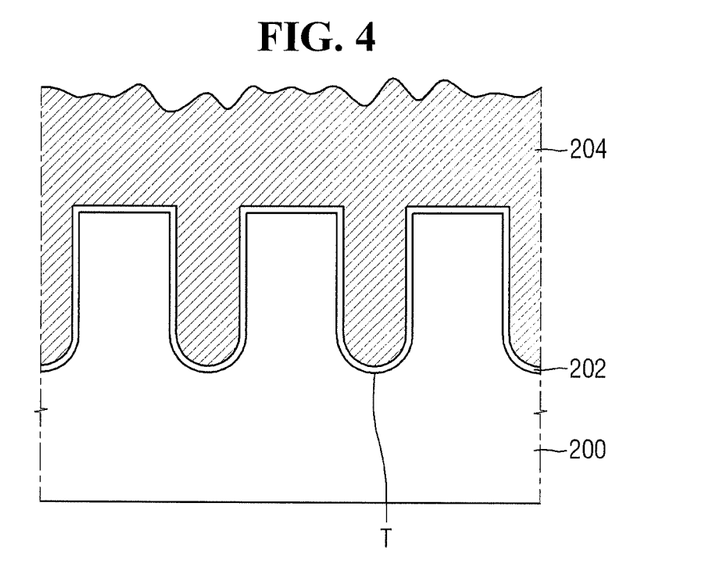

Referring to FIG. 4, a metal layer 204 is formed on the insulating layer 202.

The metal layer 204 may be formed to fill the plurality of trenches T. For example, a metal layer 204 may be formed on the insulating layer 202, using a vapor deposition process. The upper surface of the metal layer 204 may be formed to be higher than the upper surface of the substrate 200. The metal layer 204 may include, for example, tungsten, but the present disclosure is not limited thereto.

The metal layer 204 formed by the vapor deposition process may form a topology in accordance with the crystal particle size. For example, as illustrated in FIG. 4, the upper surface of the metal layer 204 may have irregular unevenness.

Figure 5:
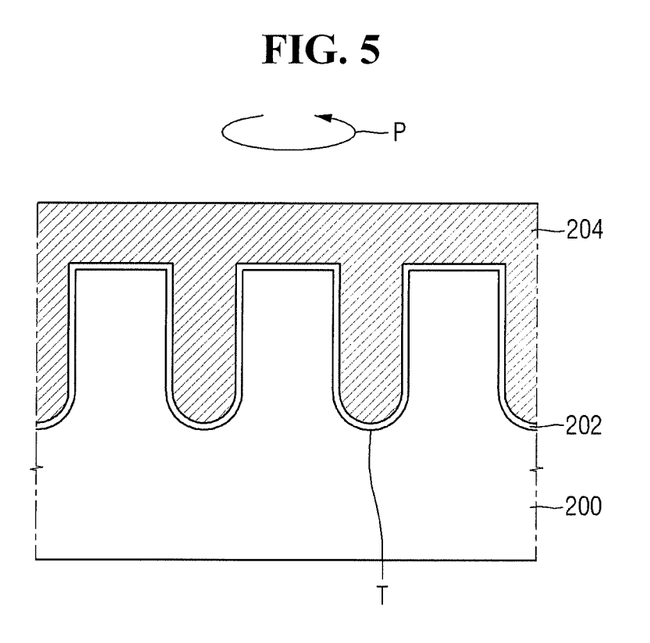

Referring to FIG. 5, the upper surface of the metal layer 204 is planarized, using a chemical mechanical polishing process P.

The chemical mechanical polishing process P uses the slurry composition for polishing the metal layer according to some embodiments of the present inventive concept. For example, the chemical mechanical polishing process P may use the slurry composition for polishing the metal layer containing the first polishing regulator including at least one selected from the group consisting of polishing particles containing metal oxide, an oxidizer containing hydrogen peroxide, phosphate, phosphite, hypophosphate, and metaphosphate.

Therefore, since the chemical mechanical polishing process P may secure a high polishing rate, the productivity of the fabricating process of the semiconductor device can be improved. In addition, since the chemical mechanical polishing process P has a low static etch rate, the topology of the metal layer 204 can be improved and the surface roughness of the metal layer 204 can be minimized.

Figure 6:
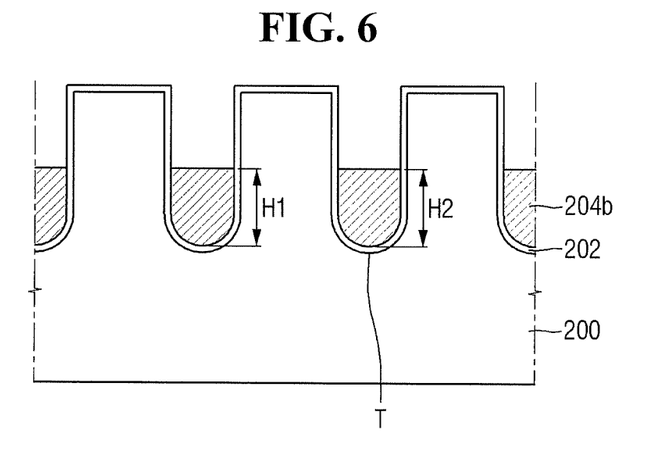

Referring to FIGS. 5 and 6, the metal layer 204 is etched to form a metal layer pattern 204b.

Specifically, the metal layer pattern 204b can be formed, by etching the metal layer 204 so that the upper surface of the metal layer 204 is lower than the upper surface of the substrate 200. As a result, the metal layer pattern 204b may fill a part of each of the trenches T.

The metal layer pattern 204b can be formed, using an etch-back process. For example, the metal layer pattern 204b may be formed using a MEB (Metal Etch Back) process, but the present disclosure is not limited thereto.

Depending on the fabricating process, the metal layer pattern 204b filling each of the trenches T may have a height dispersion. For example, a first height H1 of the metal layer pattern 204b filling one trench T may be different from a second height H2 of the metal layer pattern 204b filling the other trench T.

However, since the method for fabricating a semiconductor device according to some embodiments of the present inventive concept utilizes the chemical mechanical polishing process P, it is possible to minimize the height dispersion of the metal layer pattern 204b filling each of the trenches T. As described above, the chemical mechanical polishing process P may minimize the surface roughness of the metal layer 204. Thus, by minimizing the surface roughness of the metal layer 204 before the etch-back process according to FIG. 6, it is possible to minimize the height dispersion of the metal layer pattern 204b after the etch-back process. For example, the first height H1 of the metal layer pattern 204b filling one trench T may be substantially the same as the second height H2 of the metal layer pattern 204b filling the other trench T.

Figure 7:
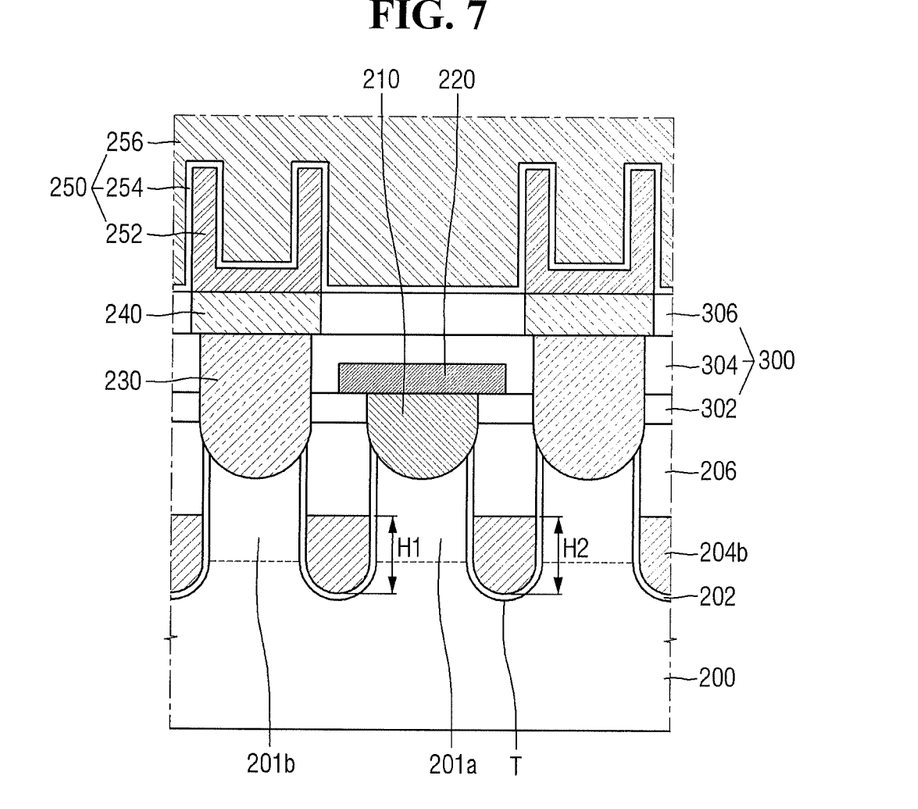

Next, referring to FIG. 7, a first source/drain region 201a, a second source/drain region 20b, a capping layer 206, an interlayer insulating layer 300, a direct contact 210, a bit line 220, a buried contact 230, a landing pad 240, and a capacitor 250 may be formed on the resulting product of FIG. 6 to fabricate the semiconductor device.

The first source/drain region 201a and the second source/drain region 201b may be formed by doping the top of the substrate 200 with an impurity. For example, when the substrate 200 is doped with an impurity of a first conductivity type (for example, P type), the impurity of a second conductivity type (for example, N type) may be doped on the substrate 200 to form the first source/drain region 201a and the second source/drain region 201b. The first source/drain region 201a and the second source/drain region 201b may be formed in the substrate 200 on both sides of the trench T.

The capping layer 206 may be formed on the metal layer pattern 204b. Specifically, the capping layer 206 may be formed on the upper surface of the metal layer pattern 204b and the side wall of the insulating layer 202. At this time, the capping layer 206 may be formed to fill the trench T. Also, the upper surface of the capping layer 206 may be disposed on substantially the same plane as the upper surface of the substrate 200. The capping layer 206 may include, for example, an oxide layer, a nitride layer, an oxynitride layer, or a combination thereof.

The interlayer insulating layer 300 may be formed on the substrate 200. The interlayer insulating layer 300 may a single layer, but may include a plurality of layers. For example, as illustrated, the interlayer insulating layer 300 may include a first interlayer insulating layer 302, a second interlayer insulating layer 304, and a third interlayer insulating layer 306 sequentially laminated. The interlayer insulating layer 300 may include, for example, silicon oxide, silicon nitride, silicon oxynitride, or a combination thereof.

The direct contact 210 may be buried in the interlayer insulating layer 300 and may be connected to the first source/drain region 201a. For example, as illustrated, the direct contact 210 may be connected to the first source/drain region 201a through the first interlayer insulating layer 302 and the second interlayer insulating layer 304. The direct contact 210 contains a conductive material and may be electrically connected to the first source/drain region 201a.

The bit line 220 may be formed on the direct contact 210. The bit line 220 may include a conductive material and may be electrically connected to the direct contact 210. As a result, the bit line 220 may be electrically connected to the first source/drain region 201a.

The buried contact 230 is buried in the interlayer insulating layer 300 and may be connected to the first source/drain region 201a. For example, as illustrated, the buried contact 230 may be connected to the second source/drain region 201b through the first interlayer insulating layer 302 and the second interlayer insulating layer 304.

The buried contact 230 may include a conductive material and may be electrically connected to the second source/drain region 201b. For example, the buried contact 230 may include polysilicon doped with impurities. Also, for example, the buried contact 230 may include metal, metal suicide, metal nitride, or a combination thereof.

The landing pad 240 is formed on the buried contact 230 and may be connected to the buried contact 230. For example, as illustrated, the landing pad 240 may be formed on the second interlayer insulating layer 304 and may be connected to the buried contact 230.

Further, the landing pad 240 may include a conductive material and may be electrically connected to the buried contact 230. For example, the landing pad 240 may include tungsten, but the present disclosure is not limited thereto.

The capacitor 250 is formed on the landing pad 240 and may be connected to the landing pad 240. For example, as illustrated, the capacitor 250 is formed on the third interlayer insulating layer 306 and may be connected to the landing pad 240. As a result, the capacitor 250 may be electrically connected to the second source/drain region 201b.

The capacitor 250 may store electric charges in the semiconductor memory element or the like. Specifically, the capacitor 250 may include a lower electrode 252, a capacitor dielectric layer 254, and an upper electrode 256. The capacitor 250 may store electric charge in the capacitor dielectric layer 254, using the potential difference generated between the lower electrode 252 and the upper electrode 256.

The lower electrode 252 and the upper electrode 256 may include, for example, doped polysilicon, metal or metal nitride. Also, the capacitor dielectric layer 254 may include, for example, silicon oxide or a high dielectric constant material. However, the present disclosure is not limited thereto.

When the metal layer pattern 204b has a height dispersion, electrical characteristics of the fabricated semiconductor device may be degraded. For example, when the first height H1 is different from the second height 112, gate induced drain leakage (GIDL) may occur in the fabricated semiconductor device However, since the method for fabricating the semiconductor device according to some embodiments of the present inventive concept utilizes the chemical mechanical polishing process P, it is possible to minimize the height dispersion of the metal layer pattern 204b filling each of the trenches T. For example, the first height H1 may be substantially the same as the second height H2. Thus, the method for fabricating a semiconductor device according to some embodiments of the present inventive concept can improve the electrical characteristics of the semiconductor device.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A slurry composition for polishing a metal layer, the slurry composition comprising:
   polishing particles including a metal oxide;
   an oxidizer including hydrogen peroxide; and
   a first polishing regulator including at least one selected from a group consisting of phosphate, phosphite, hypophosphite, and metaphosphate, wherein a content of the first polishing regulator is 1 wt % to 6 wt % with respect to 100 wt % of the slurry composition for polishing the metal layer,
   wherein a content of the oxidizer is 0.01 wt % to 0.09 wt % with respect to 100 wt % of the slurry composition for polishing the metal layer.

2. The slurry composition for polishing the metal layer of claim 1, wherein the metal oxide comprises at least one selected from a group consisting of silica, ceria, zirconia, alumina, titania, barium titania, germania, mangania, and magnesia.

3. The slurry composition for polishing the metal layer of claim 1, wherein a content of the polishing particles is 1 wt % to 6 wt % with respect to 100 wt % of the slurry composition for polishing the metal layer.

4. The slurry composition for polishing the metal layer of claim 1, wherein the content of the oxidizer is 0.03 wt % to 0.07 wt % with respect to 100 wt % of the slurry composition for polishing the metal layer.

5. The slurry composition for polishing the metal layer of claim 1, wherein the first polishing regulator includes at least one selected from a group consisting of potassium phosphate, potassium monohydrogen phosphate, potassium dihydrogen phosphate, ammonium phosphate, monoammonium phosphate, diammonium hydrogen phosphate, aluminum phosphate, sodium phosphate, disodium hydrogen phosphate, carbamoyl phosphate, calcium phosphate, triallyl phosphate, vanadium phosphate, magnesium phosphate, aluminum hypophosphite, vanadium hypophosphite, manganese hypophosphite, zinc hypophosphite, nickel hypophosphite, cobalt hypophosphite, ammonium hypophosphite, potassium hypophosphite, manganese phosphate, lead phosphate, nickel phosphate, cobalt phosphate, sodium trimetaphosphate, sodium pentametaphosphate, sodium hexametaphosphate, sodium polymetaphosphate, sodium hypophosphite, ammonium trimetaphosphate, ammonium pentametaphosphate, ammonium hexametaphosphate, ammonium polymetaphosphate, ammonium hypophosphite, potassium trimetaphosphate, potassium hexametaphosphate, potassium polymetaphosphate, potassium hypophosphite, and calcium hypophosphite.

6. The slurry composition for polishing the metal layer of claim 1, wherein the content of the first polishing regulator is 1.5 wt % to 5 wt % with respect to 100 wt % of the slurry composition for polishing the metal layer.

7. The slurry composition for polishing the metal layer of claim 1, further comprising:
   a second polishing regulator including persulfate.

8. The slurry composition for polishing the metal layer of claim 7, wherein, the second polishing regulator includes at least one selected from a group consisting of ammonium persulfate, sodium persulfate, potassium persulfate, iron (II) persulfate, lead (II) persulfate, iron (III) persulfate, tin (IV) persulfate, lead (IV) persulfate, nickel (II) persulfate, tin (II) persulfate, antimony (III) persulfate, copper (I) persulfate, copper (II) persulfate, aluminum persulfate, silver persulfate, manganese persulfate, calcium persulfate, zinc persulfate, barium persulfate, chromium (II) persulfate, lithium persulfate, potassium monopresulfate, sodium monopersulfate, and persulfuric acid.

9. The slurry composition for polishing the metal layer of claim 7, wherein a content of the second polishing regulator is 1 wt % to 5 wt % with respect to 100 wt % of the slurry composition for polishing the metal layer.

10. The slurry composition for polishing the metal layer of claim 7, further comprising:
a third polishing regulator including an iron (III) compound.

11. The slurry composition for polishing the metal layer of claim 10, wherein the third polishing regulator includes at least one selected from a group consisting of iron sucrose, iron (III) oxide, iron (III) acetate, iron (III) sulfate, lithium iron (III) oxide, iron (III) phosphate, iron (III) pyrophosphate, iron (III) ionophore IV, ammonium iron (III) hexacyanoferrate (II), iron (III) ferrocyanide, iron (III) i-propoxide, iron (III) oxo acetate perchlorate, ammonium iron (III) citrate, iron (III) dicarbonate, iron (III) acetylacetonate, iron (III) bromide, iron (III) chloride, iron (III) arsenide, iron (III) oxalate, ammonium iron (III) oxalate iron (III) oxalate, iron (III) fluoride, iron (III) iodide, iron (III) nitrate, iron (III) phthalocyanine chloride, iron (III) perchloric, iron (III) sulphate, ammonium iron (III) sulphate, and iron (III) tartrate.

12. The slurry composition for polishing the metal layer of claim 10, wherein a content of the third polishing regulator is 1 wt % to 5 wt % with respect to 100 wt % of the slurry composition for polishing the metal layer.

13. A slurry composition for polishing a metal layer, the slurry composition comprising:
polishing particles;
an oxidizer; and
a polishing regulator,
wherein the polishing regulator includes
on the basis of 100 wt % of the slurry composition for polishing the metal layer,
1 wt % to 6 wt % of a first polishing regulator containing at least one selected from a group consisting of phosphate, phosphite, hypophosphite, and metaphosphate,
1 wt % to 5 wt % of a second polishing regulator containing persulfate, and
1 wt % 3 wt % of a third polishing regulator containing iron (III) compound.

14. The slimy composition for polishing the metal layer of claim 13, wherein the oxidizer reacts with the first polishing regulator to produce peroxy acid.

15. The slurry composition for polishing the metal layer of claim 13, wherein the oxidizer comprises hydrogen peroxide.

* * * * *